United States Patent
Emira et al.

(10) Patent No.: US 10,637,418 B2
(45) Date of Patent: Apr. 28, 2020

(54) STACKED POWER AMPLIFIERS USING CORE DEVICES

(71) Applicant: SHENZHEN GOODIX TECHNOLOGY CO., LTD., Shenzhen (CN)

(72) Inventors: Ahmed Emira, San Diego, CA (US); Rami Khatib, San Diego, CA (US); Faisal Hussien, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/028,431

(22) Filed: Jul. 6, 2018

(65) Prior Publication Data

US 2020/0014351 A1    Jan. 9, 2020

(51) Int. Cl.
| | |
|---|---|
| *H03F 3/60* | (2006.01) |
| *H03F 1/02* | (2006.01) |
| *H03F 3/189* | (2006.01) |
| *H03F 3/24* | (2006.01) |
| *H03F 3/42* | (2006.01) |

(52) U.S. Cl.
CPC ............ *H03F 3/604* (2013.01); *H03F 1/0283* (2013.01); *H03F 3/189* (2013.01); *H03F 3/24* (2013.01); *H03F 3/423* (2013.01)

(58) Field of Classification Search
USPC .................. 330/277, 295, 124 R, 290–291
See application file for complete search history.

(56) References Cited

U.S. PATENT DOCUMENTS

| | | | |
|---|---|---|---|
| 4,045,744 A | 8/1977 | Sampei | |
| 6,285,251 B1 | 9/2001 | Dent et al. | |
| 6,683,499 B2 * | 1/2004 | Lautzenhiser | H03F 1/301 330/286 |
| 7,944,307 B2 * | 5/2011 | Goldfarb | H03F 1/483 330/290 |
| 9,503,036 B2 * | 11/2016 | Hwang | H03F 3/45179 |
| 2013/0187713 A1 | 7/2013 | Acar et al. | |

FOREIGN PATENT DOCUMENTS

CN    102595681 A    7/2012

OTHER PUBLICATIONS

International Search Report dated Mar. 27, 2019 in the corresponding PCT application (application No. PCT/CN2018/121614).

* cited by examiner

*Primary Examiner* — Hieu P Nguyen
(74) *Attorney, Agent, or Firm* — Kilpatrick Townsend & Stockton LLP

(57) ABSTRACT

A power amplifier includes an input terminal configured to receive a low voltage input signal, an output terminal configured to output a high voltage output signal, and a plurality of amplifiers stacked in series between a first voltage terminal and a second voltage terminal. Each of the amplifiers includes an input capacitor, an output capacitor, an input coupled to the input terminal through the input capacitor, an output coupled to the output terminal through the output capacitor, and a feedback element coupled between the input and the output of the amplifier.

18 Claims, 7 Drawing Sheets

US 10,637,418 B2

STACKED POWER AMPLIFIERS USING CORE DEVICES

FIELD OF THE INVENTION

The present invention relates to power amplifiers, and more particularly to power amplifiers that employ core devices for high voltage and high frequency applications.

BACKGROUND OF THE INVENTION

Portable and wearable wireless devices and systems that operate from batteries require low power operation to extend the battery life. A radio frequency power amplifier (RFPA) is the most power hungry block of a wireless system. A switching RFPA is the most power efficient for constant envelope modulation such as Bluetooth and GSM. The desire to increase output power forces designers to use the battery voltage as the supply voltage for the power amplifier, which, in turn, requires utilizing IO devices as cascodes of the main switching core devices. The use of cascode devices adds significant power losses due to their parasitic capacitances and lower transconductances relative to the core devices.

FIG. 1 is an example cascode power amplifier 10 as known in the prior art. Referring to FIG. 1, a cascode power amplifier 10 includes a first transistor M1 and a second transistor M2 connected in series, i.e., the first transistor M1 has a drain connected to a source of the second transistor M2 and a source connected to ground. The second transistor M2 has a drain coupled to the battery supply voltage Vbat through an inductor L and a gate coupled to a voltage Vcasc which can be the battery supply voltage Vbat. The first transistor M1 operates as a common-source amplifier and the second transistor M2 operates as a common-gate amplifier. An RF input signal Vin is applied to a gate of the first transistor M1. The output signal Vout of the second transistor M2 has a full voltage swing from zero to Vbat and is provided to an antenna via a matching network. However, the cascode power amplifier 10 requires a high voltage manufacturing process. The high voltage transistors have a large parasitic capacitance resulting in high switching losses.

Therefore, there is a need for novel power amplifier configurations and methods that are applicable to high voltages and high frequency applications to decrease the power loss and noise behavior of the prior art.

BRIEF SUMMARY OF THE INVENTION

The present disclosure provides a novel technical solution that can overcome the drawbacks of the prior art.

According to embodiments of the present disclosure, a power amplifier may include an input terminal configured to receive a low voltage input signal, an output terminal configured to output a high voltage output signal, and a plurality of amplifiers stacked in series between a first voltage terminal and a second voltage terminal. Each of the amplifiers includes an input capacitor, an output capacitor, an input coupled to the input terminal through the input capacitor, an output coupled to the output terminal through the output capacitor, and a feedback element coupled between the input and the output of the amplifier.

Embodiments of the present disclosure also provide a power amplifier comprising an input terminal configured to receive an input signal, an output terminal configured to output an amplified signal, and a stack of N amplifiers connected across a first voltage terminal and a second voltage terminal, where N is an integer greater than 1. Each of the N amplifiers includes a first self-biased inverting amplifier, a second inverting amplifier coupled to the first self-biased inverting amplifier in series, an input capacitor having an input coupled to the input terminal and an output coupled to the first self-biased inverting amplifier, and an output capacitor having an input coupled to the second inverting amplifier and an output coupled to the output terminal.

Embodiments of the present disclosure also provide a method of utilizing core devices for amplifying a low voltage signal using a high-voltage supply Vbat, each of the core devices having an individual breakdown voltage less than the battery voltage Vbat. The method may include providing a plurality of amplifiers stacked in series between a first voltage terminal and a second voltage terminal, each of the amplifiers having an individual breakdown voltage less than the battery voltage Vbat; connecting the low voltage signal to an input terminal of the plurality of amplifiers, each of the plurality of amplifiers having an individual supply voltage lower than its breakdown voltage and configured to output an output signal in response to the low voltage signal; and connecting the output signal of each of the plurality of amplifiers to form the high voltage signal at an output terminal.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Figure 1:
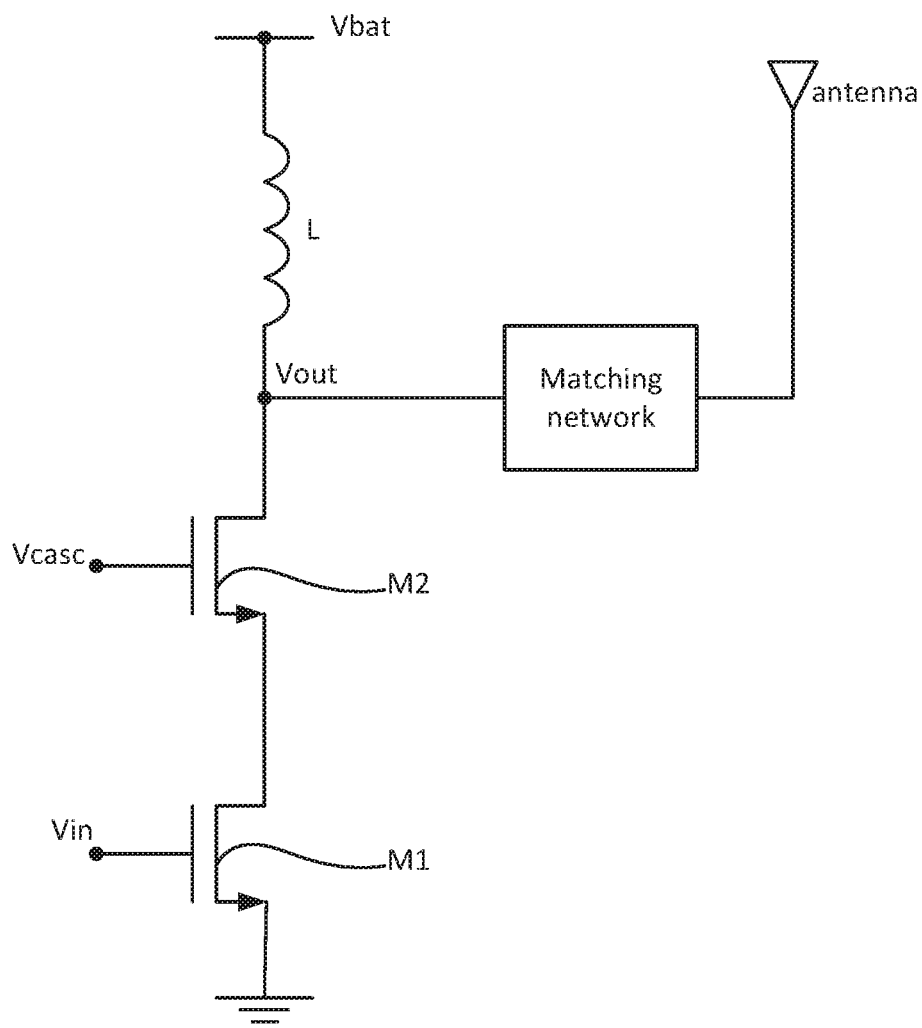
FIG. 1 is a cascode power amplifier as known in the prior art.
Figure 2:
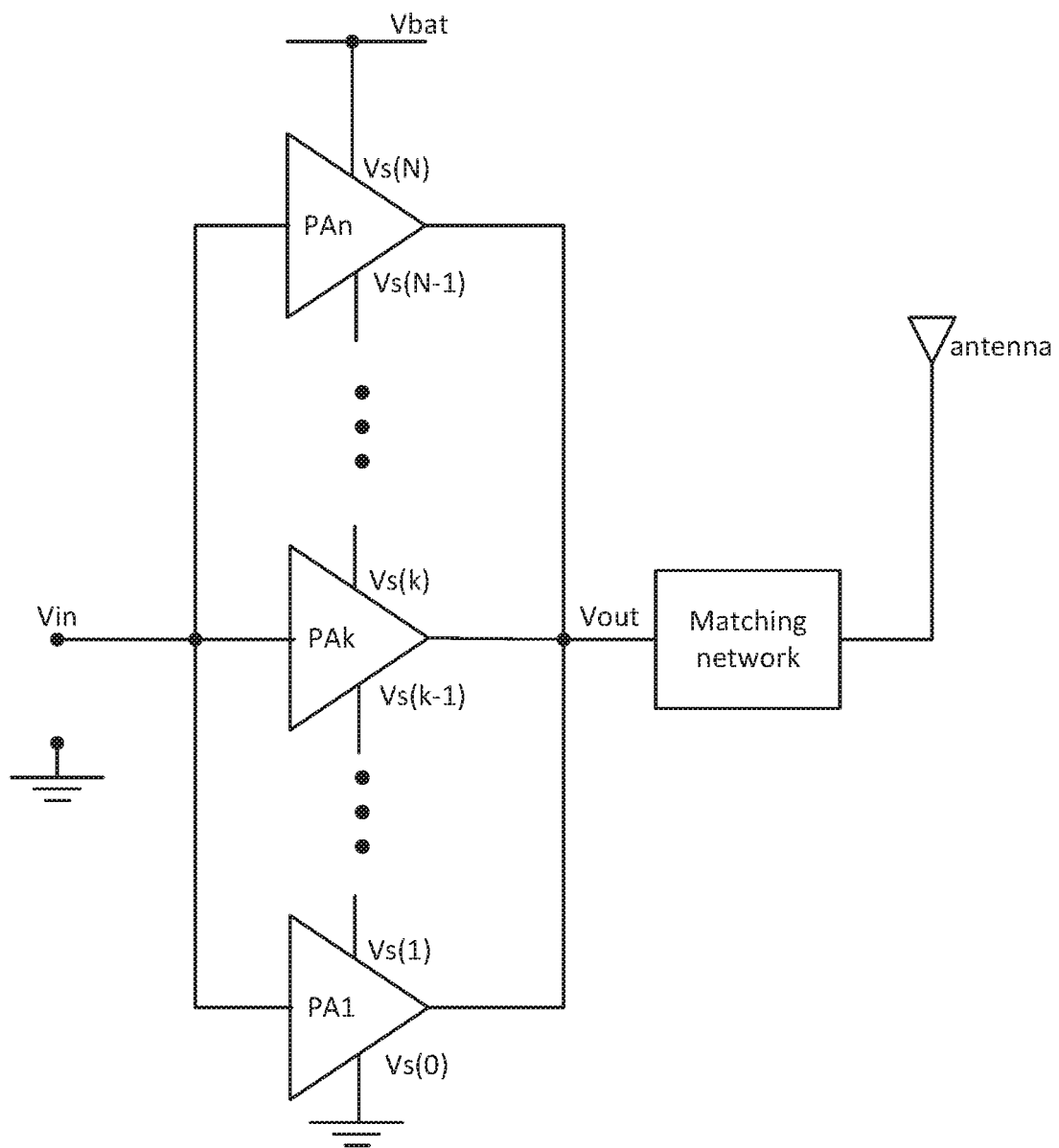
FIG. 2 is a block circuit diagram illustrating a power amplifier having a stack of core devices according to an embodiment of the present disclosure.

FIG. 2 is a block circuit diagram illustrating a power amplifier 20 having a stack of core devices according to an embodiment of the present disclosure. Referring to FIG. 2, the power amplifier 20 includes a plurality of core devices stacked in series between a first supply voltage terminal Vbat and a second supply voltage terminal ground. In one embodiment, the first supply voltage terminal is connected to a battery, and the second supply voltage terminal is coupled to a common reference voltage, which has a ground potential. For reference, the first core device adjacent to the ground potential is denoted PA1, the next core device adjacent to the first core device is denoted PA2, the k-th core device is denoted PAk, ..., and the last core device which is adjacent to the first supply voltage terminal is denoted PAn, where n is an integer. As used herein, a core device is referred to as an electronic device comprising one or more low voltage transistors having a thin gate oxide layer (e.g., on the order of 2.6 nm thick). In contrast, a high voltage MOS transistor is referred to as a transistor that is fabricated with a thicker gate oxide (on the order of 5.6 nm thick). Additionally, a high voltage MOS transistor has a longer channel length (e.g., 250 nm or more), whereas a low voltage MOS transistor has a channel length of about 40 nm (in a 40 nm technology node). Low voltage MOS transistors (also referred to as core transistors or core devices) constitute the largest portion of the chip functionality. High voltage MOS transistors (also referred to as IO transistors) are predominantly used for Input and Output signals. The low voltage MOS transistor has a far superior Figure of Merit, defined as FOM=RDS×CGS (lower is better); lower on-resistance and lower parasitic capacitance. It is highly favorable to implement an amplifier using low voltage MOS transistors provided it can be assured that the low voltage transistors can operate safely in a given supply voltage.

In one embodiment, the power amplifier 20 is an integrated circuit comprising a plurality of core devices (low voltage devices) stacked in series on top of each other between a core power supply voltage and ground, where each of the core devices may be an amplifier. In one embodiment, all of the core devices, i.e., all of the amplifiers have the same dimensions and the same gain. In one embodiment, if the number of amplifiers stacked in series between the first supply voltage terminal Vbat (having a voltage Vbat) and ground is n (n is an integer), then each of the amplifiers is supplied with a supply voltage that is Vbat/n. That is, the voltage applied across the first core device PA1 is Vs1−0V (ground)=Vbat/n, the voltage applied across the second core device PA2 is Vs2−Vs1=Vbat/n, the voltage applied across the k-th core device Pak is Vsk−Vsk−1=Vbat/n, ..., and the voltage applied across the last core device PAn is Vsn−Vsn−1=Vbat/n. A low voltage input signal Vin (e.g., having a low voltage swing Vbat/n) is applied to the input of the power amplifier 20 (i.e., Vin is applied to the input of each of the core devices PA(1 to n)), which outputs a high power output signal Vout with a Vcc output swing at the output terminal of the power amplifier 20. In one embodiment, the high power output signal is operative to drive an antenna through a matching network, which can be internal or external to the integrated circuit.

In one embodiment, the number n of stacked core devices (core amplifiers) can be determined by the following relation:

$$Vdd\text{min} < Vbat/n < Vdd\text{max},$$

where Vddmin is the minimum supply voltage for the core inverter (amplifier) to ensure a minimum output impedance to provide a required output power, and Vddmax is the maximum supply voltage that does not cause a breakdown of the core amplifier.

Figure 3:
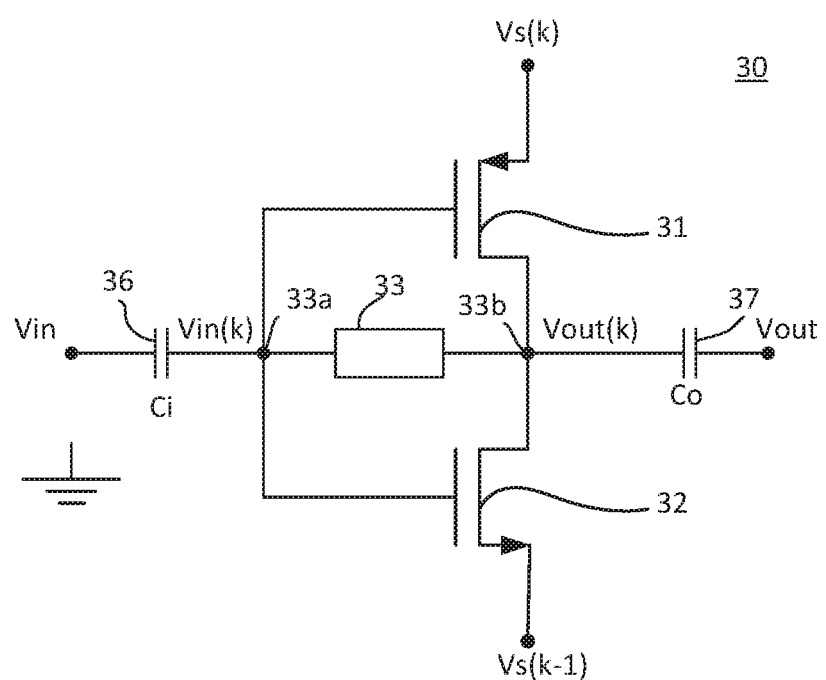
FIG. 3 is a circuit diagram of a core device according to an embodiment of the present disclosure.

FIG. 3 is a circuit diagram of a k-th core device 30 according to an embodiment of the present disclosure. The core device 30 (alternatively referred to as an amplifier or an inverting amplifier hereinafter) is a representative core device of any of the core devices in the stack of core devices (shown in FIG. 2) and includes a CMOS inverter comprising a P-channel MOS transistor (pMOS) 31 and an n-channel MOS transistor (nMOS) 32 connected in series across a voltage Vsk which is the voltage between a voltage terminal Vs(k) and a voltage terminal Vs(k−1). The core device 30 also includes a feedback element 33 disposed between an input terminal Vin(a) and an output terminal Vout(a) of the CMOS inverter. In one embodiment, the feedback element 33 is a resistive element made of a polysilicon film. In one embodiment, the feedback element 33 is an n-channel depletion-mode MOS transistor having the gate directly connected to the drain (i.e., Vgd=0V). In the static stage, there is no current flowing through the feedback element 33 so that an equilibrium voltage is established between the input terminal Vin(k) at a node 33a and the output terminal Vout(k) at a node 33b. By designing an appropriate length-to-width ratio of the channel of the pMOS 31 and the nMOS 32, an equilibrium voltage can be made equal to Vsk/2.

The core device 30 further includes an input capacitor Ci 36 having one end connected to the low voltage input signal Vin and an opposite end connected to the gate of pMOS 31 and the gate of nMOS 32. The input capacitor Ci 36 is configured to block DC components of the input signal Vin while transmitting AC components of the input signal Vin to the core device 30. The input capacitor Ci 36 is also configured to level shift up the DC level of the input signal Vin to the proper DC level of a particular stage (e.g., the k-th core device) in the stack of core devices. The core device 30 further includes an output capacitor Co 37 having an end connected to the output terminal Vout(a) of the core device 30 and the output signal Vout of the power amplifier 20. The output capacitor Co 37 is configured to block the DC operating point of the k-th core device 30 while transmitting amplified AC components to the output terminal Vout of the power amplifier 20. Since each core device in the stack of core devices of the power amplifier 20 includes an output capacitor CO 37, the AC components (e.g., AC currents or AC voltages) of all of the stacked core devices are then combined at the output terminal of the power amplifier 20. In one embodiment, the capacitance value of the output capacitor Co 37 can be chosen as part of the matching network.

Figure 4:
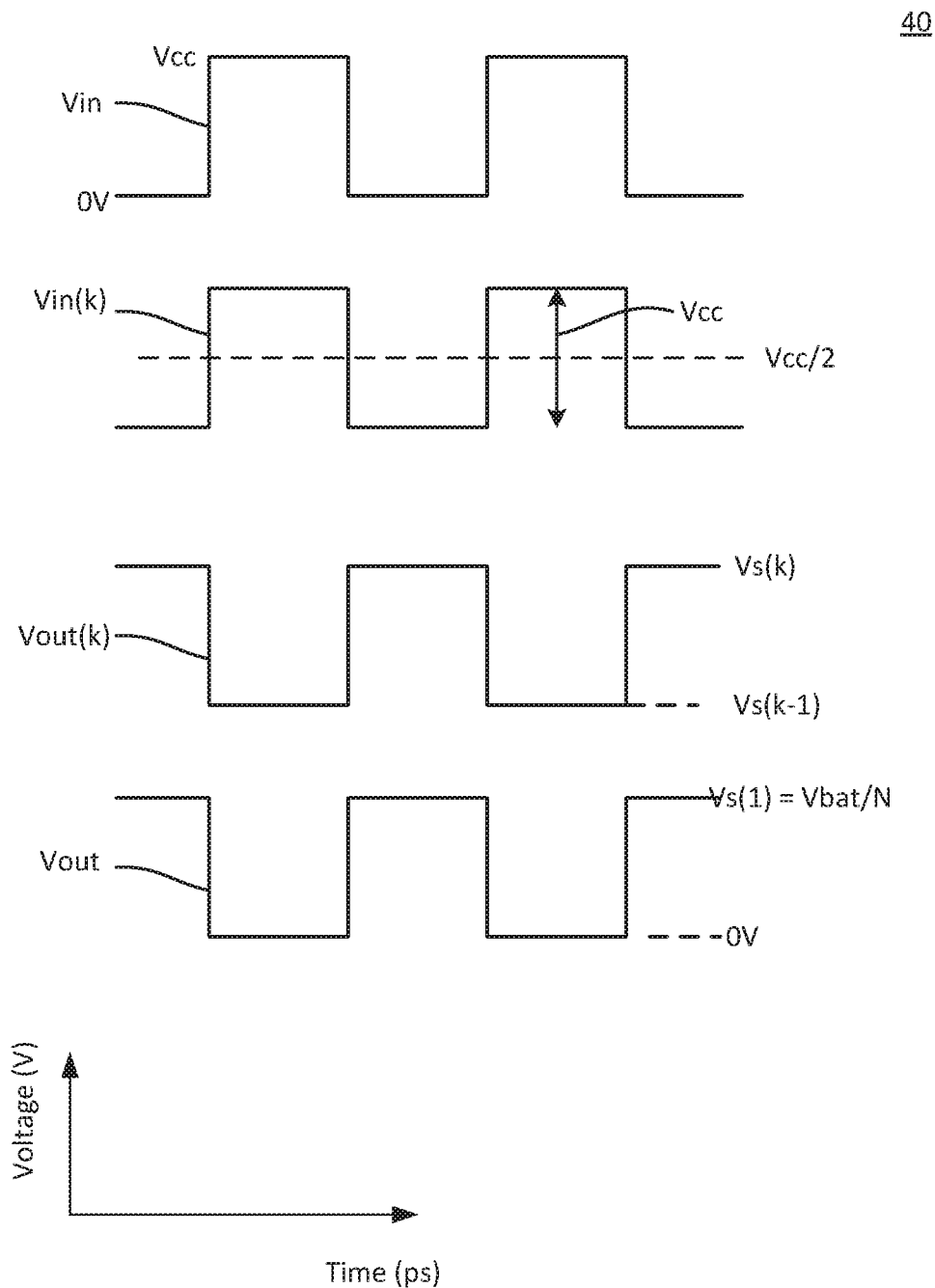
FIG. 4 is a graph illustrating an input signal, an internal input signal, an internal output signal, and an output signal of the core device of FIG. 3.

FIG. 4 is a timing diagram illustrating voltage waveforms 40 of the power amplifier 20 and a k-th core device 30 according to an embodiment of the present disclosure. The waveform 40 includes an input signal Vin, an internal input signal Vin(k) at the node 33a, an internal output signal Vout(k) at the node 33b, and an output signal Vout. It is understood that the waveforms 40 are provided as an example to facilitate understanding and are not limiting. Other waveforms and voltage values are also possible as explained further below. The x-axis represents time (in ps) and the y-axis represent voltage (in V). The waveforms 40 show an operation of the block diagram of FIG. 2 having a stack of core devices, each of which comprises an inverting amplifier configuration as shown in FIG. 3. In the example shown, the input signal Vin is a square waveform having a rail-to-rail voltage swing between Vcc and ground (0V), where Vcc is a core voltage supply that is lower than the battery voltage Vbat. The input signal Vin(a) is level shifted to Vsk/2 where Vsk=Vs(k)−Vs(k−1), and Vs(k−1) becomes a virtual ground Vgnd, i.e., Vsk=Vs(k)−Vgnd. The output signal Vout(k) is an amplified and inverted signal of the Vin(k) because the core device 30 includes a CMOS inverter, i.e., Vout(k) has a square waveform that cycles between Vsk and Vgnd. The output signal Vout is then a square waveform that cycles between 0V (ground) and Vs(k) (i.e., Vbat/n, where n is the number of core devices stacked in series on top of each other between Vbat and ground in the power amplifier 20).

Figure 5A:
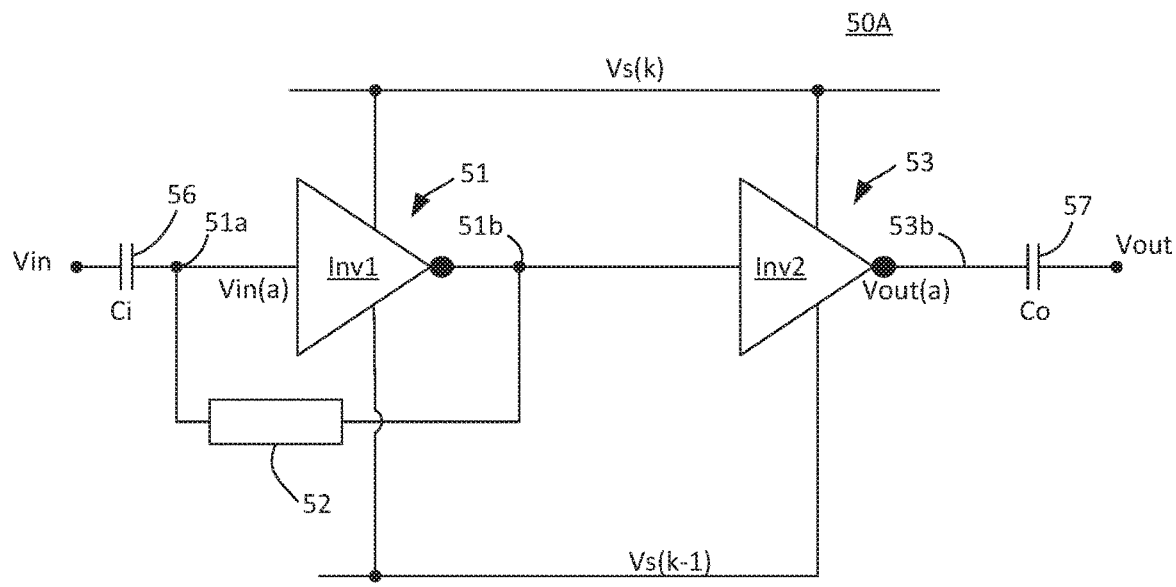
FIG. 5A is a circuit diagram of a core device according to another embodiment of the present disclosure.

FIG. 5A is a circuit diagram of a core device 50A according to another embodiment of the present disclosure. The core device 50 includes a first self-biased inverting amplifier 51, a second inverting amplifier 53 coupled in series to the first self-biased inverting amplifier 51. Each of the first and second inverting amplifiers 51, 53 includes a CMOS inverter having a pMOS transistor and an nMOS transistor connected in series across the voltage Vsk which is the voltage between a voltage terminal Vs(k) and a voltage terminal Vs(k−1). The first self-biased inverting amplifier 51 also includes a first feedback element 52 connected between an input terminal 51a and an output terminal 51b of the first CMOS inverter Inv1. In one embodiment, the CMOS inverters Inv1, Inv2 and the feedback element 52 may be the same as or similar to the CMOS inverter including the pMOS 31, the nMOS 32, and the feedback element 33 described in FIG. 3. That is, by having an appropriate length-to-width ratio of the channel of the pMOS transistor and the nMOS transistor of the CMOS inverters Inv1, Inv2, the equilibrium voltage between the nodes 51a and 51b and between the nodes 51b and 53b can be made equal to Vs(k)/2.

Figure 5B:
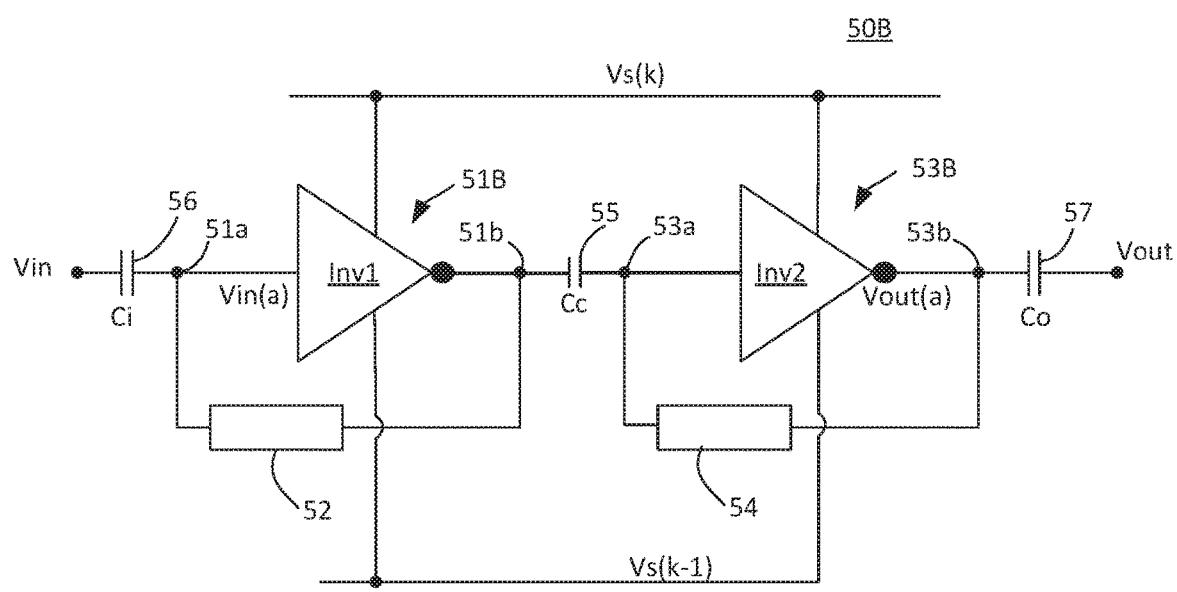
FIG. 5B is a circuit diagram of a core device according to yet another embodiment of the present disclosure.

FIG. 5B is a circuit diagram of a core device 50B according to yet another embodiment of the present disclosure. Referring to FIG. 5B, the core device 50B includes a first self-biased inverting amplifier 51B, a second self-biased inverting amplifier 53B coupled in series to the first self-biased inverting amplifier 51 via a coupling capacitor Cc 55. Each of the first and second self-biased inverting amplifiers 51B, 53B is independently DC self-biased. That is, the first self-biased inverting amplifier 51B determines its own DC bias level, and the second self-biased inverting amplifier 53B determines its own bias level. The second self-biased inverting amplifier 53B also includes a second feedback element 54 connected between an input terminal 53a and an output terminal 53b of the second CMOS inverter Inv2. In one embodiment, the first and second CMOS inverters Inv1, Inv2 may have same dimensions or sizes (e.g., the same W/L ratio). In another embodiment, the first and second CMOS inverters Inv1, Inv2 may have different dimensions or sizes. In one embodiment, the first and second CMOS inverters Inv1, Inv2 have the same gain. In one embodiment, the second CMOS inverter Inv2 may have a gain higher than the gain of the first CMOS inverter Inv1. The configuration of having two self-biased inverting amplifiers connected in series provides the benefits of higher gain and less distortion of the non-inverting amplified output signal Vout(k).

Figure 6:
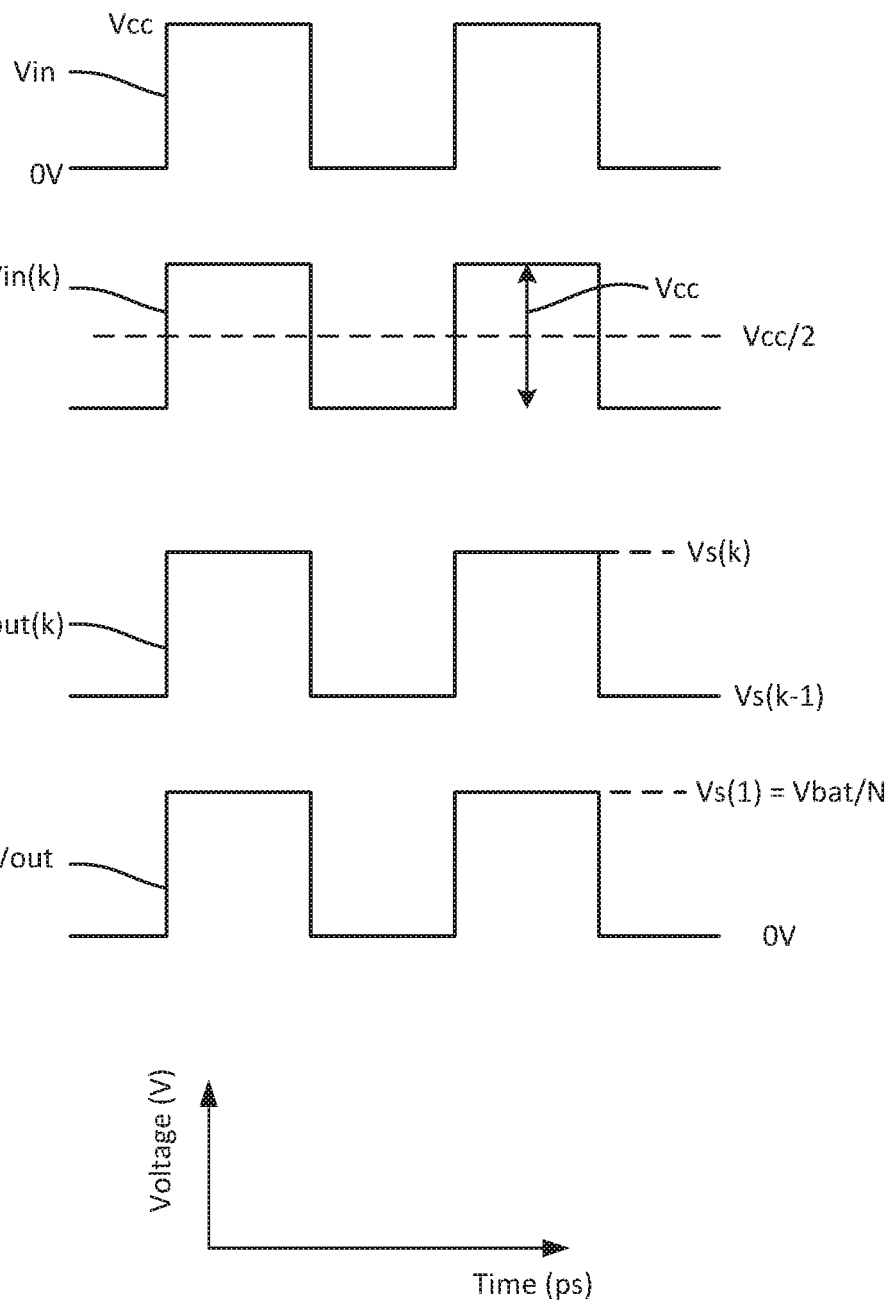
FIG. 6 is a graph illustrating an input signal, an internal input signal, an internal output signal, and an output signal of the core device shown in FIG. 5A or FIG. 5B.

FIG. 6 is timing diagram illustrating voltage waveforms 60 of the power amplifier 20 and a k-th core device 50 according to an embodiment of the present disclosure. The waveform 60 includes an input signal Vin, an internal input signal Vin(k) at the node 51a, an internal output signal Vout(a) at the node 53b, and an output signal Vout. It is understood that the waveforms 60 are provided as an example to facilitate understanding and are not limiting. Other waveforms and voltage values are also possible as known by one of ordinary skill in the art. The x-axis represents time (in ps) and the y-axis represent voltage (in V). The waveforms 60 show an operation of the block diagram of FIG. 2 having a stack of core devices, each of which comprises an amplifier configuration 50 as shown in FIG. 5. In the example shown, the input signal Vin is a square waveform having a rail-to-rail voltage swing between Vcc and ground (0V), where Vcc is a core voltage supply that is lower than the battery voltage Vbat. The input signal Vin(k) is level shifted to Vsk/2 where Vsk=Vs(k)−Vs(k−1), and Vs(k−1) becomes a virtual ground Vgnd, i.e., Vsk=Vs(k)−Vgnd. The output signal Vout(a) at the node 53b is an amplified non-inverting signal of the Vin(a) because the core device 50 includes two self-biased CMOS inverters connected in series, i.e., Vout(k) has a square waveform having the same polarity as Vin and cycles between Vsk and Vgnd. The output signal Vout is then a square waveform that cycles between 0V (ground) and Vsk (i.e., Vbat/n, where n is the number of core devices stacked in series between Vbat and ground in the power amplifier 20).

Figure 7:
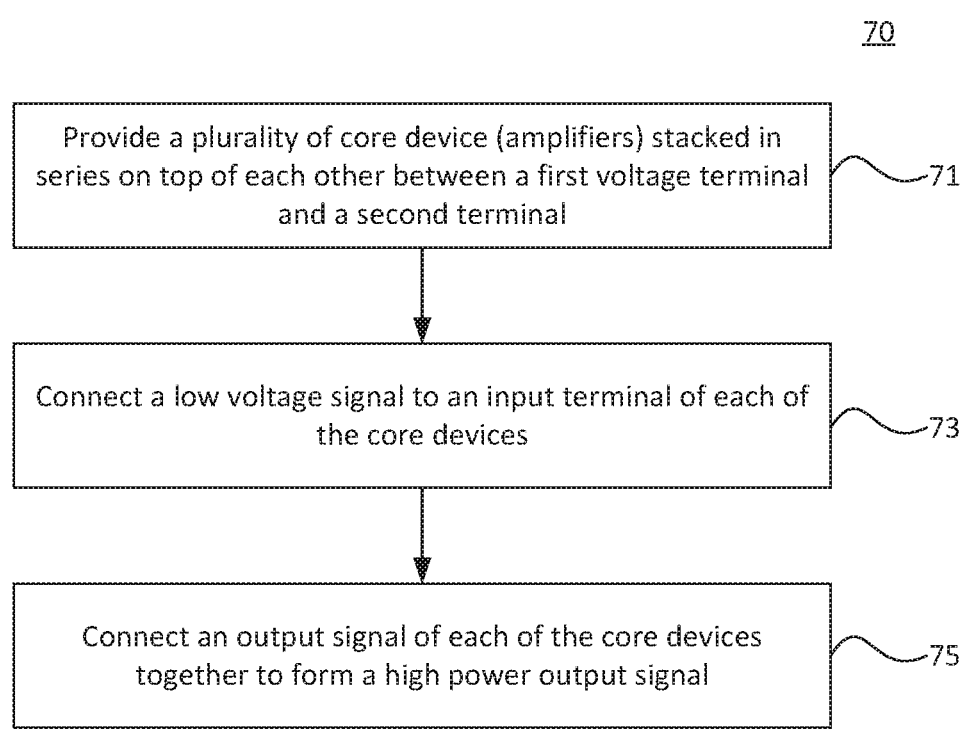
FIG. 7 is a flowchart illustration a method of utilizing core devices having an individual breakdown voltage less than a maximum supply voltage according to an embodiment of the present disclosure.

FIG. 7 is a flowchart illustration a method 70 of utilizing a power amplifier comprising a plurality of core devices (e.g., amplifiers) where each core device has an individual breakdown voltage that is less than a maximum voltage Vmax of an output signal according to an embodiment of the present disclosure. The method 70 provides, at block 71, a plurality of amplifiers stacked in series between a first voltage terminal and a second voltage terminal. The plurality of amplifiers are core devices having an individual supply voltage Vs that is lower than the maximum voltage Vmax of the output signal. The individual voltage Vs is low enough such that it will not damage the amplifiers; i.e., it is lower than the breakdown voltage of the amplifiers. The method 70 further includes connecting a low voltage core signal to an input of the amplifiers, which, in turn, provide a low voltage output signal in response to the low voltage core signal at block 73. At block 75, the method 70 also includes connecting the low voltage output signal of each of the amplifiers to form a high power signal at an output terminal of the power amplifier.

In one embodiment, the power amplifier may be the power amplifier 20 shown in FIG. 2, and each core device may have the configuration of a self-bias inverting amplifier (CMOS inverter) 30 of FIG. 3. In the embodiment, the low voltage signal is the core signal Vin having a magnitude of Vcc, and the output signal of each of the self-bias inverting amplifier 30 has a magnitude that is equal to Vbat/N, where Vbat is the voltage of a battery and N is the total number of inverting amplifiers stacked in series between Vbat and ground.

In another embodiment, the power amplifier may be the power amplifier 20 shown in FIG. 2, and each core device may have the configuration of the core device 50A shown in FIG. 5A or the core device 50B shown in FIG. 5B. In an example embodiment, referring to FIG. 5B, each core device 50B includes a first self-biased inverting amplifier 51B, a second self-biased inverting amplifier 53B coupled in series to the first self-biased inverting amplifier 51B via a coupling capacitor Cc 55. In this embodiment, the low voltage signal is the core signal Vin having a magnitude of Vcc, and the output signal Vout of each of the core device 50 has a magnitude that is equal to Vbat/N, where Vbat is the voltage of a battery and N is the total number of core devices 50 stacked in series between Vbat and ground.

As described in the background section, IO devices are devices that have a thick gate oxide so that they can support high voltage level signals. However, thick gate-oxide devices have high power consumption due to their parasitic capacitances and lower transconductances relative to core devices that are thin gate-oxide devices, that consume significantly less power and have a reduced noise figure. The different embodiments of the present disclosure provide advantageous configurations of a power amplifier that employs core devices to generate high voltage high frequency signals at the output of the power amplifier.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A power amplifier, comprising:
an input terminal configured to receive a low voltage input signal;
an output terminal configured to output a high voltage output signal; and
a plurality of amplifiers stacked in series between a first voltage terminal and a second voltage terminal, each of the plurality of amplifiers having an output coupled to the output terminal,
wherein each of the plurality of amplifiers is an inverting amplifier comprising a P-channel transistor and an N-channel transistor connected in series, a P-channel transistor of a k-th amplifier being connected to an N-channel transistor of an adjacent (k+1)th amplifier in series, and an N-channel transistor of the k-th amplifier being connected to a P-channel transistor of an adjacent (k−1)th amplifier, wherein the k-th amplifier has a supply voltage that is lower than a supply voltage of the (k+1)th amplifier and higher than a supply voltage of the (k−1)th amplifier.

2. The power amplifier of claim 1, wherein each of the amplifiers comprises:
an input capacitor;
an output capacitor;
an input coupled to the input terminal through the input capacitor;
the output coupled to the output terminal through the output capacitor; and
a feedback element coupled between the input and the output of the amplifier.

3. The power amplifier of claim 1, wherein the first voltage terminal is coupled to a battery having a battery voltage Vbat, and the second voltage terminal is coupled to ground.

4. The power amplifier of claim 3, wherein the plurality of amplifiers comprises N amplifiers stacked in series between the battery voltage Vbat and ground, N being a positive integer, the N amplifiers each having a same dimension and a same gain; and the N amplifiers satisfy the following relation:

$$Vdd\text{min} < Vbat/n < Vdd\text{max},$$

wherein Vddmin is a minimum supply voltage for an amplifier to ensure a minimum output impedance to provide a required output power, and Vddmax is a maximum supply voltage that does not cause a breakdown of the amplifier.

5. The power amplifier of claim 3, wherein the plurality of amplifiers comprise N amplifiers stacked in series between the battery voltage Vbat and ground, N being a positive integer, the N amplifiers each being supplied with a voltage that is equal to Vbat/N.

6. The power amplifier of claim 2, wherein the feedback element comprises a n-channel depletion mode metal oxide semiconductor (MOS) transistor having a gate and a source directly connected together or a resistive element.

7. The power amplifier of claim 1, wherein each of the plurality of amplifiers comprises:
a first self-biased inverting amplifier;
a second self-biased inverting amplifier coupled in series to the first self-biased inverting amplifier; and
a capacitor disposed between the first self-biased inverting amplifier and the second self-biased inverting amplifier.

8. A power amplifier, comprising:
an input terminal configured to receive an input signal;
an output terminal configured to output an amplified signal; and
a stack of N amplifiers connected across a first voltage terminal and a second voltage terminal, N being an integer greater than 2, each of the N amplifiers comprising:
a first self-biased inverting amplifier;
a second inverting amplifier coupled to the first self-biased inverting amplifier in series;
an input capacitor having an input coupled to the input terminal and an output coupled to the first self-biased inverting amplifier;
an output capacitor having an input coupled to the second inverting amplifier and an output coupled to the output terminal; and
an output coupled to the output terminal.

9. The power amplifier of claim 8, wherein a voltage applied across the first voltage terminal and the second voltage terminal is a maximum supply voltage Vmax, each of the N amplifiers being applied a supply voltage equal to Vmax/N.

10. The power amplifier of claim 8, wherein the stack of N amplifiers are amplifiers disposed in a core region of an integrated device.

11. The power amplifier of claim 8, wherein the first voltage terminal is coupled to a battery having a voltage Vbat, the second voltage terminal is coupled to ground, and the stack of N amplifiers satisfies the following relation:

$$Vdd\text{min} < V\text{bat}/n < Vdd\text{max},$$

wherein Vddmin is a minimum supply voltage for an amplifier to ensure a minimum output impedance to provide a desired output power, and Vddmax is a maximum supply voltage that does not cause a breakdown of the amplifier.

12. The power amplifier of claim 11, wherein each of the stack of N amplifiers is supplied with a voltage that is equal to Vbat/N.

13. A method of utilizing core devices for amplifying a low voltage signal to a high power signal operating from a maximum voltage Vmax, each of the core devices having a breakdown voltage less than the maximum voltage Vmax, the method comprising:
providing a plurality of amplifiers stacked in series between a first voltage terminal and a second voltage terminal, each of the amplifiers having an individual breakdown voltage less than the maximum voltage Vmax;
connecting the low voltage signal to an input terminal of the plurality of amplifiers, each of the plurality of amplifiers having an individual supply voltage lower than the maximum voltage Vmax and configured to output an output signal in response to the low voltage signal; and
connecting the output signal of each of the plurality of amplifiers to form the high power signal at a same output terminal,
wherein each of the plurality of amplifiers comprises:
an input capacitor;
an output capacitor,
a self-biased inverting amplifier having an input coupled to the input capacitor and an output coupled to the output capacitor; and
a feedback element coupled between the input and the output of the self-biased inverting amplifier.

14. The method of claim 13, wherein the self-biased inverting amplifier is an inverter based amplifier including complementary metal oxide semiconductor (CMOS) or bipolar junction transistor (BJT) devices connected in series across the individual supply voltage.

15. The method of claim 13, further comprising;
connecting the first voltage terminal to a battery having a battery voltage Vbat, the battery voltage Vbat being equal to the maximum voltage Vmax;
connecting the second voltage terminal to a ground potential;
wherein the plurality of amplifiers comprise a number N of amplifiers stacked in series between the battery voltage Vbat and ground, the N amplifiers each satisfies the following relation:

$$Vdd\text{min} < V\text{bat}/n < Vdd\text{max},$$

wherein Vddmin is a minimum supply voltage for an amplifier to ensure a minimum output impedance to provide a desired output power, and Vddmax is a maximum supply voltage that does not cause a breakdown of the amplifier.

16. The method of claim 13, wherein each of the plurality of amplifiers comprises:
a first self-biased inverting amplifier;
a second inverting amplifier coupled to the first self-biased inverting amplifier in series;
a coupling capacitor between the first self-biased inverting amplifier and the second inverting amplifier;
an input capacitor having an input coupled to the input terminal and an output coupled to the first self-biased inverting amplifier; and
an output capacitor having an input coupled to the second inverting amplifier and an output coupled to the output terminal.

17. The method of claim 13, further comprising;
connecting the first voltage terminal to a battery having a battery voltage Vbat;
connecting the second voltage terminal to a ground potential;
wherein the plurality of amplifiers comprise N amplifiers stacked in series between the battery voltage Vbat and the ground potential, the N amplifiers each satisfies the following relation:

$$Vdd\text{min} < V\text{bat}/n < Vdd\text{max},$$

wherein Vddmin is a minimum supply voltage that ensures a minimum supply voltage for an amplifier to provide a required output power, and Vddmax is a maximum supply voltage that does not cause a breakdown of the amplifier.

18. The method of claim 13, wherein a voltage applied across the first voltage terminal and the second voltage terminal is a maximum supply voltage Vmax, the plurality of amplifiers comprising N amplifiers, each of the amplifiers being applied a supply voltage equal to Vmax/N.

* * * * *